(12) United States Patent
Lützen et al.

(10) Patent No.: US 6,633,061 B2
(45) Date of Patent: Oct. 14, 2003

(54) SOI SUBSTRATE, A SEMICONDUCTOR CIRCUIT FORMED IN A SOI SUBSTRATE, AND AN ASSOCIATED PRODUCTION METHOD

(75) Inventors: Jörn Lützen, Dresden (DE); Bernhard Sell, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/939,998

(22) Filed: Aug. 27, 2001

(65) Prior Publication Data
US 2002/0042169 A1 Apr. 11, 2002

(30) Foreign Application Priority Data
Aug. 27, 2000 (DE) .......................... 100 41 748

(51) Int. Cl.[7] .................. H01L 27/108; H01L 29/76; H01L 29/94; H01L 31/119
(52) U.S. Cl. ................. 257/305; 257/301; 257/349; 257/350; 257/354
(58) Field of Search ................. 257/301, 302, 257/303, 305, 349, 350, 354

(56) References Cited

U.S. PATENT DOCUMENTS

| 5,387,555 | A | | 2/1995 | Linn et al. |
| 5,517,047 | A | * | 5/1996 | Linn et al. .................. 257/347 |
| 5,953,622 | A | | 9/1999 | Lee et al. |
| 6,015,990 | A | * | 1/2000 | Hieda et al. ................. 257/310 |

OTHER PUBLICATIONS

Kimura et al.: "Epitaxial film transfer technique for producing single crystil Si film on an insulating substrate", App. Phys. Lett. 43 (3) Aug. 1, 1983, pp. 263–265.

* cited by examiner

Primary Examiner—Ngân V. Ngô
(74) Attorney, Agent, or Firm—Laurence A. Greenberg; Werner H. Stemer; Gregory L. Mayback

(57) ABSTRACT

In a SOI substrate, a semiconductor circuit formed in a SOI substrate, and an associated production method, a multilayer barrier layer with a potential barrier and a diffusion barrier is used to reliably prevent diffusion of impurities between element layers. This allows semiconductor circuits to be produced with smaller structure sizes and with a higher integration density.

9 Claims, 11 Drawing Sheets

SOI SUBSTRATE, A SEMICONDUCTOR CIRCUIT FORMED IN A SOI SUBSTRATE, AND AN ASSOCIATED PRODUCTION METHOD

BACKGROUND OF THE INVENTION

FIELD OF THE INVENTION

The present invention relates to a SOI substrate, a semiconductor circuit formed in a SOI substrate, and an associated production method, and in particular to a SOI substrate having a special multilayer barrier layer, in order to provide a large number of element layers.

SOI (silicon on insulator) substrates have been used as the original material in the field of semiconductor technology for a long time. The advantage of using such SOI substrates is, first, less sensitivity to radiation influences (silicon on sapphire) and the capability to use lower voltages than those which can be used with conventional silicon substrates. Particularly when producing semiconductor circuits with semiconductor elements in different element layers based on a SOI-DRAM, as is described, for example, in U.S. Pat. No. 5,508,219, the use of novel materials often results in problems as a result of the characteristic properties of the semiconductor elements being destroyed or made poorer because of the incompatibility with the semiconductor material of the SOI substrate.

SUMMARY OF THE INVENTION

It is accordingly an object of the invention to provide a SOI substrate, an associated production method, and a semiconductor circuit formed in a SOI substrate together with an associated production method which overcome the abovementioned disadvantageous of the prior art apparatus and methods of this general type, and which, in particular, in a simple and cost-effective manner, prevents mutual interference arising from the materials which are used.

With the foregoing and other objects in view there is provided, in accordance with the invention, a SOI substrate, that includes: a first element layer; at least one further element layer; and at least one isolation layer located between the first element layer and the further element layer. The isolation layer includes a diffusion barrier and a multilayer barrier layer with a potential barrier.

In accordance with an added feature of the invention, the multilayer barrier layer includes a plurality of different isolation layers.

In accordance with an additional feature of the invention, the multilayer barrier layer includes an $SiO_2/Si_3N_4/SiO_2$ layer sequence.

In accordance with another feature of the invention, the multilayer barrier layer includes at least one isolation layer and at least one conductive layer.

In accordance with a further feature of the invention, the multilayer barrier layer includes at least one conductive layer including a material that is selected from the group consisting of Ti, TiSi, Ta, TaN, TiN, Pt, Ru, RuO, Ir, Mo, Co, Ni, Hf, Zr, Ni—Si, MoN, HfN, MoSi, CoSi, TaSi, Au, Ag, Cu, Al, WSiN, C, Fe, W, WN and $WSi_x$.

In accordance with a further added feature of the invention, the at least one further element layer includes a layer that is selected from the group consisting of an isolating layer, a semiconductive layer and a conductive layer.

In accordance with a further additional feature of the invention, the multilayer barrier layer includes a thermal compensation layer.

With the foregoing and other objects in view there is provided, in accordance with the invention, a method for producing a SOI substrate having a plurality of element layers, that includes the following steps: a) forming an element layer and at least one part of a multilayer barrier layer on a first wafer; b) forming a splitting boundary layer and at least a further part of the multilayer barrier layer on at least one second wafer; c) connecting the first wafer and the at least one second wafer to form a common multilayer barrier layer such that the common multilayer barrier layer has a potential barrier and a diffusion barrier; and d) splitting a part of the at least one second wafer at the splitting boundary layer.

In accordance with an added mode of the invention, the method includes steps of: providing the first wafer with a semiconductor substrate; providing the second wafer with a semiconductor substrate; in step a), forming an $SiO_2/Si_3N_4/SiO_2$ layer sequence as a part of the multilayer barrier layer on the first wafer; and in step b), forming an $SiO_2$ layer as a part of the multilayer barrier layer on the second wafer.

In accordance with an additional mode of the invention, the method includes steps of: providing the first wafer with an isolating substrate; providing the second wafer with a semiconductor substrate; in step a), forming a conductive layer/$SiO_2$ layer sequence as a part of the multilayer barrier on the first wafer; and in step b), forming an $SiO_2$ layer as a part of the multilayer barrier layer on the second wafer.

In accordance with another mode of the invention, the method includes, in step a), forming the multilayer barrier layer with a conductive layer that includes a material selected from the group consisting of Ti, TiSi, Ta, TaN, TiN, Pt, Ru, RuO, Ir, Mo, Co, Ni, Hf, Zr, NiSi, MoN, HfN, MoSi, CoSi, TaSi, Au, Ag, Cu, Al, WSiN, C, Fe, W, WN and $WSi_x$.

In accordance with a further mode of the invention, the method includes, in step c), using a wafer bonding method to connect the first wafer and second wafer.

In accordance with a further added mode of the invention, the method includes using a heat treatment to perform the step of splitting the part of the at least second wafer at the splitting boundary layer.

With the foregoing and other objects in view there is provided, in accordance with the invention, a semiconductor circuit, that includes a SOI substrate with: a first element layer, at least one second element layer, and at least one isolation layer located between the first element layer and the second element layer. The isolation layer includes a diffusion barrier and a multilayer barrier layer with a potential barrier. The semiconductor circuit also includes: at least one first semiconductor element that is formed in the first element layer; at least one second semiconductor element that is formed in the at least second element layer; and a conductive diffusion barrier layer electrically connecting the first semiconductor element and the second semiconductor elements.

With the foregoing and other objects in view there is provided, in accordance with the invention, a DRAM memory cell, that includes a SOI substrate with: a first element layer, at least one second element layer, and at least one isolation layer located between the first element layer and the second element layer. The isolation layer includes a diffusion barrier and a multilayer barrier layer with a potential barrier. The DRAM memory cell also includes: at least one first semiconductor element that is formed in the first element layer; at least one second semiconductor element that is formed in the at least second element layer; and a conductive diffusion barrier layer electrically connecting the first semiconductor element and the second semiconductor elements. The first semiconductor element includes a selection transistor; and the second semiconductor element includes a trench capacitor.

With the foregoing and other objects in view there is provided, in accordance with the invention, a method for producing a semiconductor circuit in a SOI substrate, that includes providing a SOI substrate that includes: a first element layer, at least one second element layer, and at least one isolation layer located between the first element layer and the second element layer. The isolation layer includes a diffusion barrier and a multilayer barrier layer with a potential barrier. The method also includes steps of: forming a mask layer corresponding to the multilayer barrier layer; using the mask layer to form a deep trench into the second element layer; forming at least one second semiconductor element in the second element layer; forming at least one conductive diffusion barrier layer that prevents diffusion of impurities into the first element layer, the at least one conductive diffusion barrier layer also serving for connection to the at least one second semiconductor element; and forming at least one first semiconductor element in the first element layer.

In accordance with an added mode of the invention, the method includes forming the at least one semiconductor element as a trench capacitor.

In accordance with an additional mode of the invention, the method includes, when performing the step of forming the at least one second semiconductor element, widening the trench in the second element layer.

In accordance with another mode of the invention, the method includes, when performing the step of forming the at least one second semiconductor element, widening the trench in the second element layer.

In accordance with a further mode of the invention, the method includes, before forming the second semiconductor element, forming an isolating diffusion barrier layer to prevent diffusion of impurities into the first element layer.

In accordance with a further added mode of the invention, the method includes, forming a contact on the second element layer by forming an enlarged, deep trench.

Particularly when using an isolation layer which has a multilayer barrier layer with a potential barrier and a diffusion barrier, the SOI substrate not only reliably prevents the occurrence of leakage currents, but also allows the use of novel materials for forming semiconductor elements in a further element layer in the semiconductor substrate. In particular, it is in this way reliably possible to prevent diffusion of impurities or elements of the novel materials into one of the element layers, as a result of which the semiconductor elements are decoupled and are not subject to interference.

The multilayer barrier layer is preferably composed of a large number of different isolation layers, which have different potential and diffusion barriers. However, it can also be composed of at least one isolation layer and at least one conductive layer, which allows specific semiconductor circuits to be considerably improved and simplified.

An optimum SOI substrate for any field of application can be produced by using an isolating layer, a semiconductive layer or a conductive layer for the further element layer or support layer.

The multilayer barrier layer preferably also has a thermal compensation layer, which makes it possible to compensate for stresses which occur during heat treatment, particularly when using different materials.

A semiconductor circuit formed in such a SOI substrate preferably includes a first and a second semiconductor element, which are formed in the first and second element layer and are electrically connected to one another via a conductive diffusion barrier layer. This makes it possible to prevent incompatible materials from diffusing out via the necessary connecting paths thus making it possible to prevent any negative mutual influences between the elements in the various element layers during a production process or in operation.

The semiconductor circuit may, for example, include a DRAM memory circuit, with the semiconductor elements in the first element layer being selection transistors, and the semiconductor elements in the second element layer being trench capacitors. Semiconductor circuits such as these allow previously unachieved integration densities to be obtained on the basis of the use of the novel materials that are now possible, thus considerably increasing the memory capacity for a given chip area.

Further advantageous refinements of the invention are characterized in the further claims.

Other features which are considered as characteristic for the invention are set forth in the appended claims.

Although the invention is illustrated and described herein as embodied in a SOI substrate, a semiconductor circuit formed in it, and an associated production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
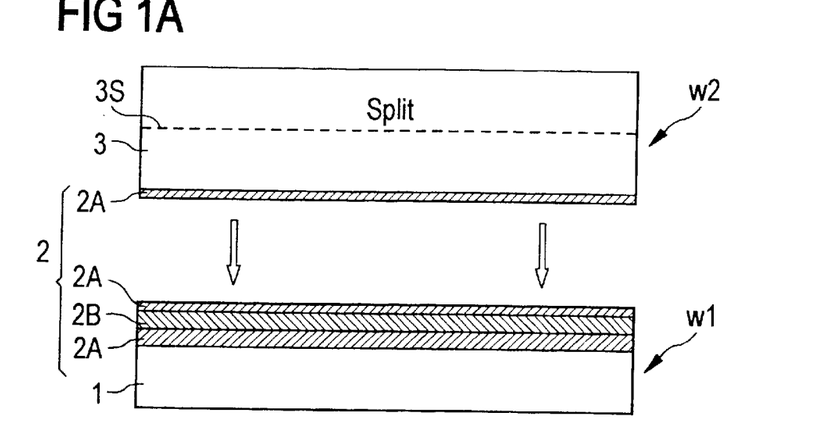
FIGS. 1A to 1C show simplified cross-sectional views of the SOI substrate, in order to illustrate associated production steps.
Figure 1B:
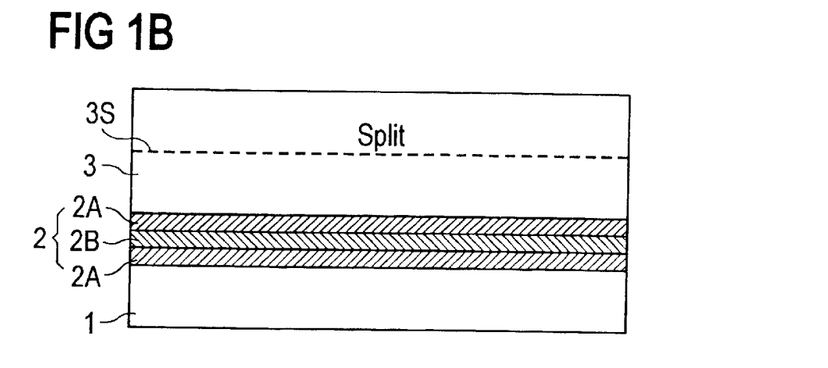
Figure 1C:
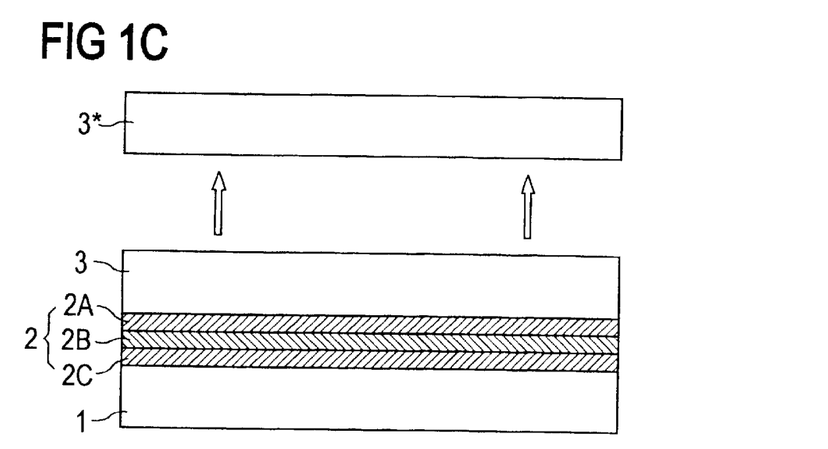

Referring now to the figures of the drawing in detail and first, particularly, to FIGS. 1A–1C thereof, there is simplified cross-sectional views of the major method steps used to produce an inventive SOI substrate. In some respects, the method corresponds to a production method used for producing conventional SOI substrates, for which reason the conventional method steps will not be described in detail in the following text.

According to FIG. 1A, a first wafer or support wafer W1 is initially provided with at least a part of a multilayer barrier layer 2. To be more precise, an $SiO_2$ layer 2A is deposited or formed thermally, for example, as shown in FIG. 1A, and is used essentially as a potential barrier, and thus for electrical isolation. An electrically isolating diffusion barrier layer 2B is then formed on this and is composed, for example, of an $Si_3N_4$ layer. In addition to its isolating function, this diffusion barrier layer 2B is used essentially as a diffusion barrier in order to prevent diffusion of impurities such as those which occur when using novel materials. The already formed multilayer barrier layer is then oxidized once again, or an oxide layer is deposited, thus resulting in the formation of the further $SiO_2$ layer 2A on the support wafer W1.

Furthermore, a second wafer W2 (donor wafer) is provided with H implantation, for example, in order to form a splitting boundary layer 3S, whose surface is, furthermore, oxidized or provided with a thin $SiO_2$ layer 2A. The wafers W1 and W2 are preferably composed of a semiconductor substrate such as Si, but any other semiconductor material may also be used.

According to FIG. 1B, in a subsequent method step, the oxidized surfaces of the first (support) wafer W1 are connected to the second wafer W2 by means of known wafer bonding methods. In particular, since identical isolation layers 2A are used on the first wafer W1 and on the second wafer W2, this results in a very simple and stable connection.

According to FIG. 1C, the upper part 3* of the semiconductor substrate 3 is separated by means of heat treatment, which leads to the wafer being delaminated/split along the implanted splitting boundary layer (preferably hydrogen). This results in the remaining SOI substrate, which is illustrated in FIG. 1C, with its first semiconductor layer or element layer 3, its multilayer barrier layer 2 and the second element layer or support layer 1. The specific composition of the multilayer barrier layer, including layers which represent a diffusion barrier and layers which represent a potential barrier, now makes it possible to use even incompatible materials in the production of semiconductor circuits.

Such novel materials are, for example, the use of dielectrics such as $Al_2O_3$, $TiO_2$, $Ta_2O_5$, $ZrO_2$, $HfO_2$, $La_2O_3$, $ZrSi_xO_y$, $HfSi_xO_y$. Furthermore, TiN, WN, TaN etc. can now be used as barriers or electrode layers. In addition, Ti, W, Ta, Si (doped, for example, with B, P, As, etc.), TaSiN, TiSi, TaSi, CoSi, MoSi, $WSi_x$, $WSi_xN_y$, PT, Ru, RuO and Ir can be used as electrode layers. The materials mentioned above are merely examples, and the present invention is not limited to them. However, the multilayer barrier layer 2 which is used results in complete electrical isolation and material separation between the two element layers 1 and 3, for which reason semiconductor elements formed in them are not influenced in any way by novel materials, which would normally have a potentially interfering effect.

Furthermore, the multilayer barrier layer 2 may have a conductive (not illustrated) semiconductive or isolating thermal compensation layer, thus making it possible to compensate for the (thermal) stresses which occur when using different substrate materials.

According to FIGS. 1A to 1C, a semiconductor wafer having a semiconductor substrate 1 as the support layer was used for the first wafer W1. However, the invention is not restricted to this and, in fact, also relates to those wafers in which the support layer or element layer 1 is composed of a conductive material, a semiconductive material or an insulating material. In the same way, the SOI substrate is also not restricted to a purely isolating multilayer barrier layer 2, but also covers multilayer barrier layers which, for example, are composed of an isolation layer, which will be described later, and a conductive layer.

Figure 2A:
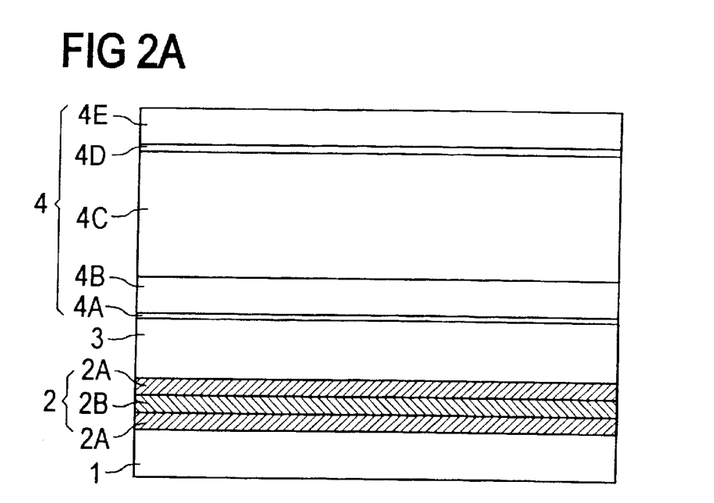
FIGS. 2A to 2N show simplified cross-sectional views in order to illustrate a production method for a first exemplary embodiment of a DRAM memory cell.
Figure 2B:
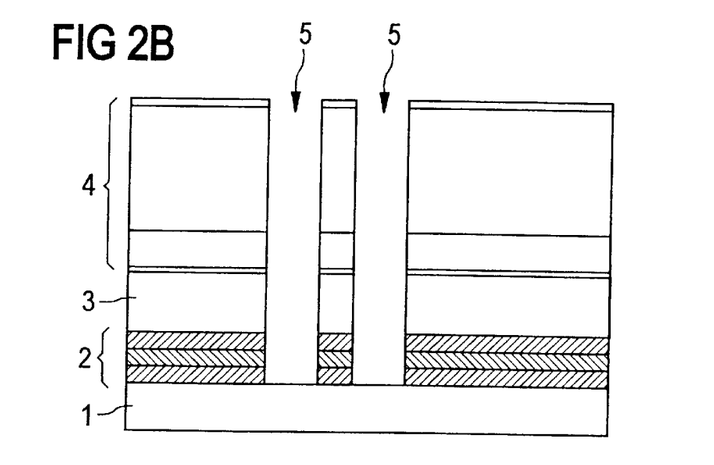
Figure 2C:
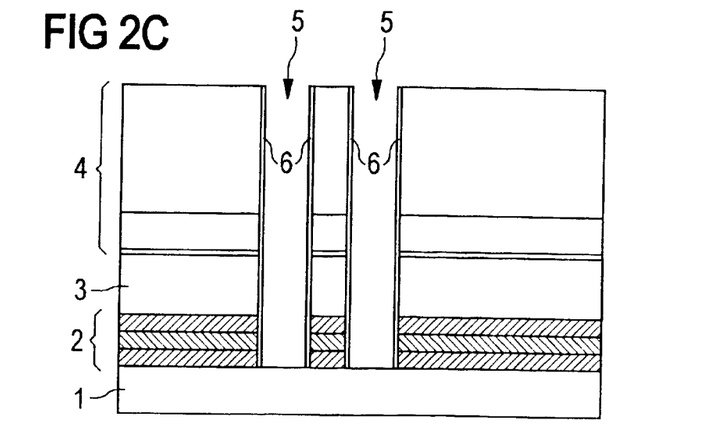
Figure 2D:
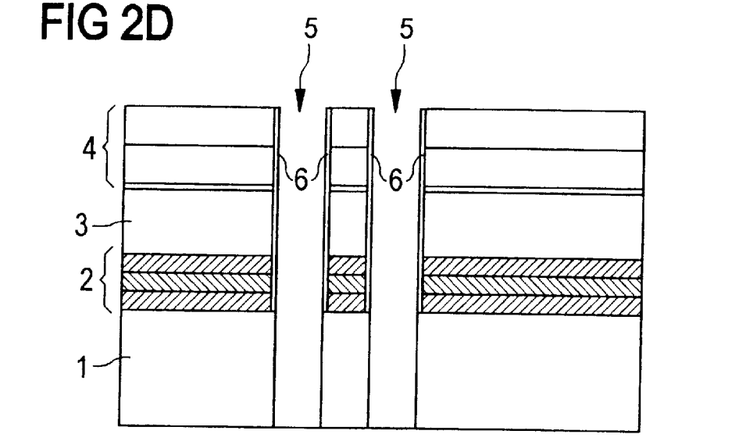
Figure 2E:
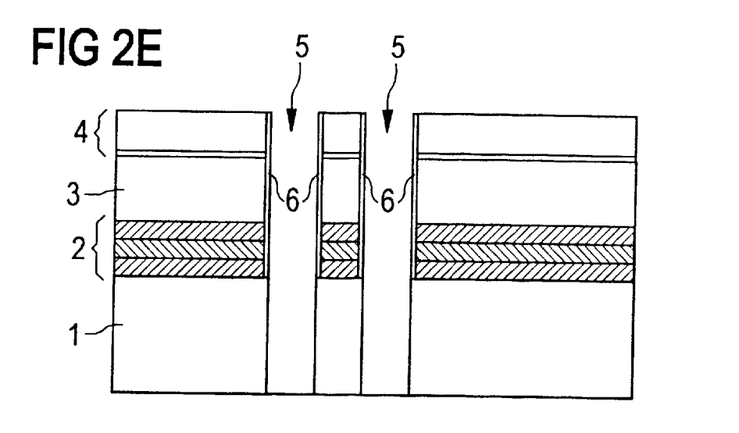
Figure 2F:
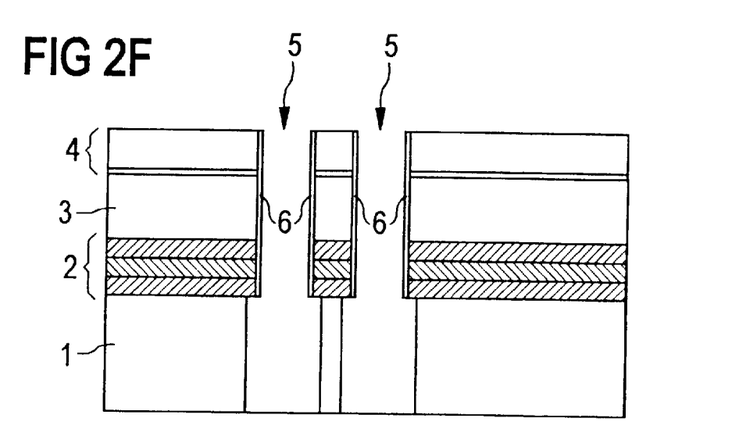
Figure 2G:
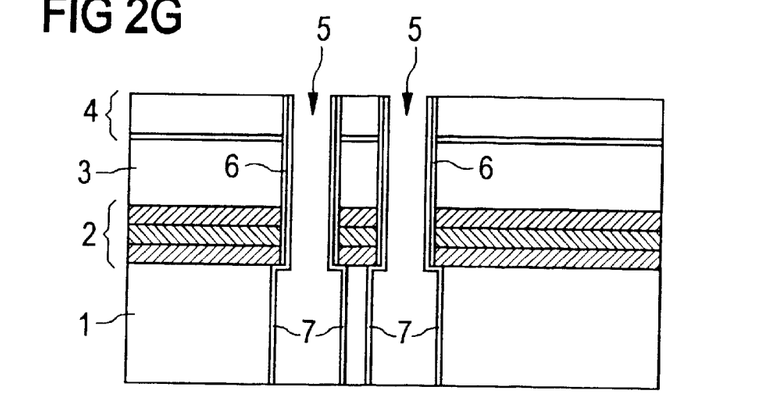
Figure 2H:
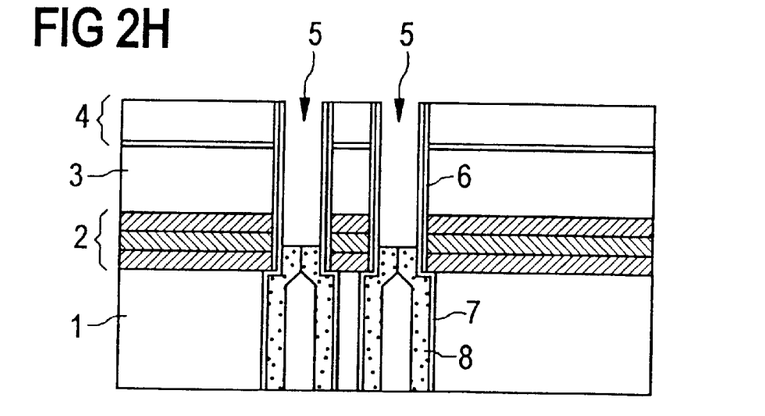
Figure 2I:
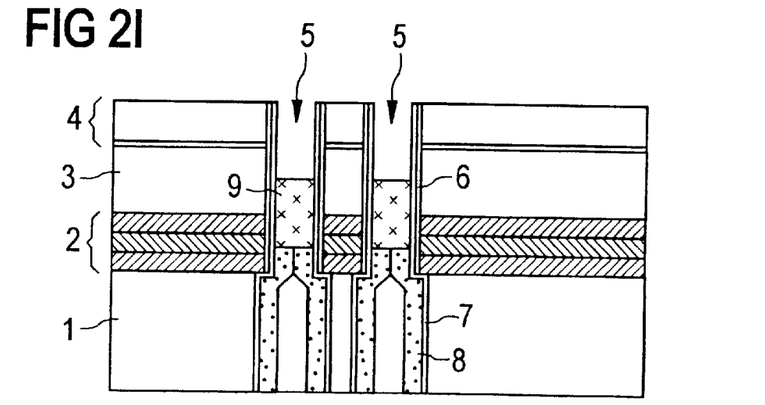
Figure 2J:
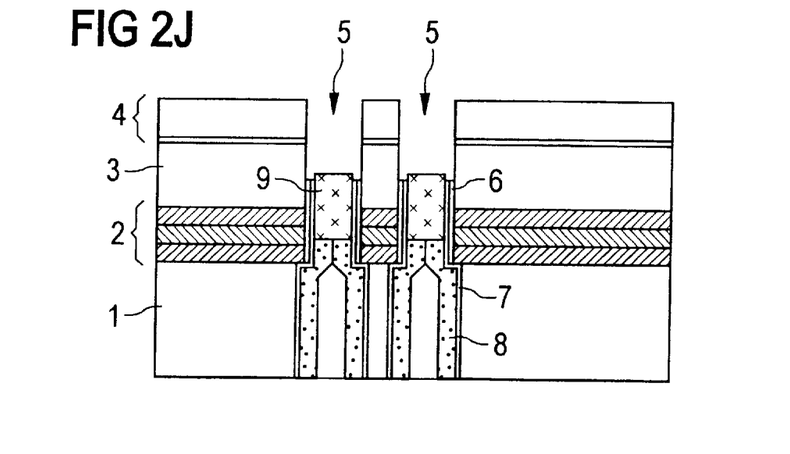
Figure 2K:
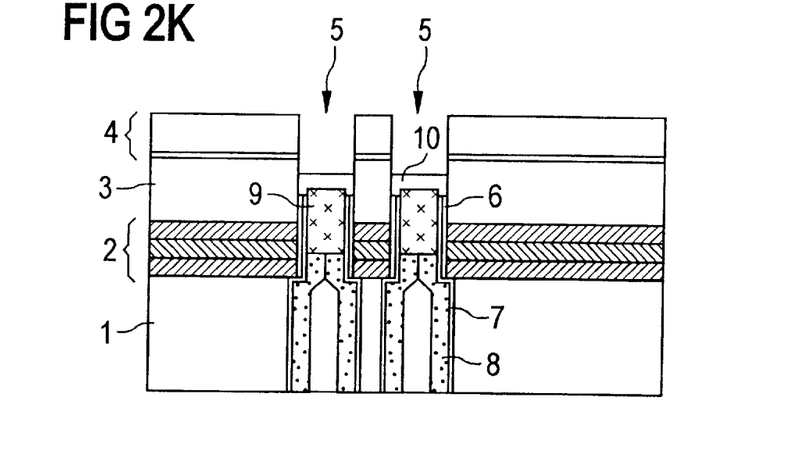
Figure 2L:
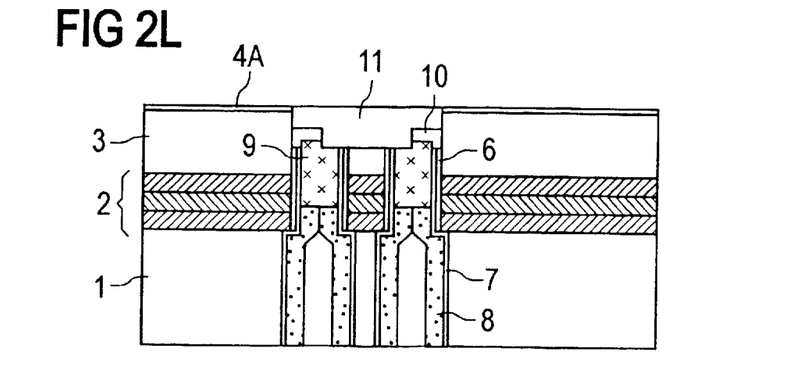
Figure 2M:
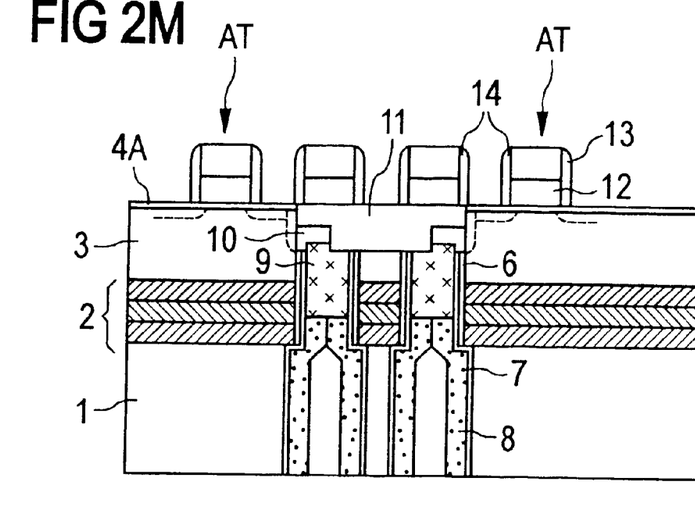
Figure 2N:
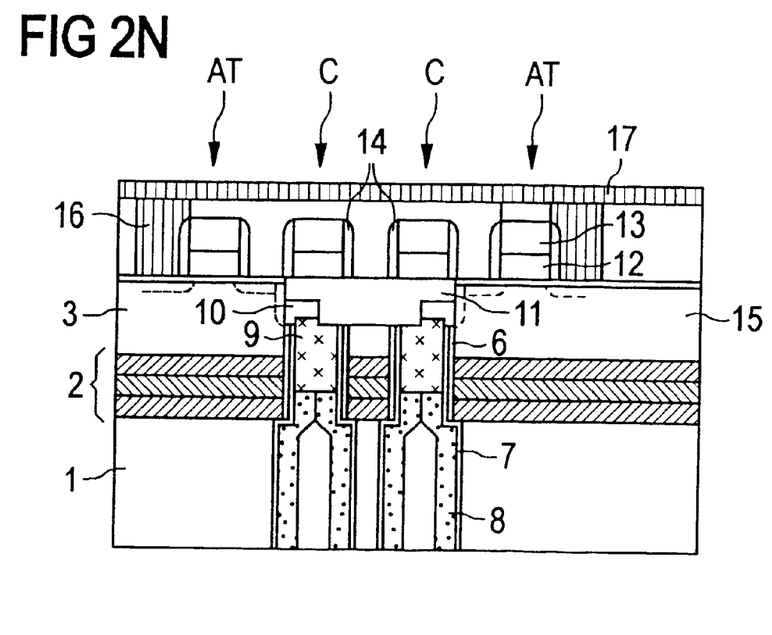

FIGS. 2A to 2N show simplified cross-sectional views in order to illustrate method steps for producing a first exemplary embodiment of a semiconductor circuit. The same reference symbols in this case relate to the same or similar layers, for which reason they will not be described again in the following text.

According to FIG. 2A, an initial material with a 10 nm thick oxide layer 2A, a 100 nm thick nitride layer 2B and a 100 nm thick oxide layer 2A is used, for example, as the basis for the SOI substrate, on which there is a 400 nm thick silicon layer as the first element layer 3 and which, together with the support layer and the second element layer 1, represents the initial material. To provide a mask which corresponds in particular to the multilayer barrier layer 2, a mask layer 4 is applied to the SOI substrate and, as shown in FIG. 2A, this mask layer 4 is composed of a very thin oxidation layer 4A, a pad nitride layer 4B, a boron-silicate glass layer (BSG) 4C, a nitride layer 4D and a poly-hard mask 4E. It should be mentioned that different mask layers 4 must be used in an appropriate manner when using different SOI substrates.

As shown in FIG. 2B, a structure for a trench 5 is then formed using a conventional lithographic method, and the poly-hard mask layer 4E is etched using, for example, a plasma etching method. The resist is then removed, followed by plasma etching of the nitride layer 4D, of the boron-silicate glass layer 4C, of the nitride layer 4B and of the oxide layer 4A. The nitride layer 4D is now used as a mask to etch the 400 nm thick silicon layer or first element layer 3, for example by means of plasma etching, and, furthermore, to remove the oxide layer 2A, the nitride layer 2B, and the oxide layer 2A of the multilayer barrier layer 2. As shown in FIG. 2C, an approximately 10 nm thick $Si_3N_4$ layer 6 is then deposited as a nitride liner on the walls of the trenches 5, and acts not only as an etching mask but also as a diffusion barrier for subsequent method steps. Furthermore, the nitride layer 6 deposited on the horizontal surfaces is removed once again, preferably by means of an anisotropic etching method. As shown in FIG. 2D, the actual deep trench 5 is then etched in the support layer 1 or the further element layer and the remaining BSG layer 4C is removed, as shown in FIG. 2E.

As shown in FIG. 2F, a lower region of the trench 5 can optionally be widened in a subsequent step using the $Si_3N_4$ layer 6 as a mask thus, for example, achieving an increase in the capacitance of a trench capacitor. This widening is preferably carried out by means of a wet etching method.

In the region around the lower part of the trench, the substrate is preferably doped by means of gas-phase doping (GPD). Other measures may be used.

As shown in FIG. 2G, a capacitor dielectric 7 is now formed on the surface of the trench 5, for which purpose, for example, oxidized nitride can be used. However, it is now preferably possible for this dielectric also to be composed of materials which in the past were regarded as being incompatible with conventional silicon processes, for example the dielectrics mentioned above and, in particular, dielectrics with a high relative dielectric constant. Owing to the use of the SOI substrate with its multilayer barrier layer 2, which acts as a potential barrier and diffusion barrier, such materials can now no longer penetrate from the element layer 1 into the element layer 3.

As shown in FIG. 2H, once a buried plate (not illustrated) has been formed as an opposing electrode, an inner electrode layer 8 is formed in the trench 5, and is recessed to a predetermined extent within the multilayer barrier layer 2. While polysilicon was preferably used for the electrode material in the past, with its relatively high resistivity, novel electrode materials can now be used which have a high conductivity and, furthermore, have excellent filling properties. Even if the structure sizes are very small and the trenches are very deep, this results in semiconductor elements and trench capacitors formed in the further element layer 1.

As shown in FIG. 2I, a conductive diffusion barrier layer 9 is then formed for connection of the electrode layer 8 and in order to prevent diffusion of impurities into the first element layer 3, and is recessed to a predetermined depth within the first element layer 3.

As shown in FIG. 2J, the capacitor dielectric 7 and the $Si_3N_4$ layer 6, which acts as the diffusion barrier layer 6, are then removed. Since the trench capacitor which is formed in the further element layer 1 is now terminated by the conductive diffusion barrier layer 9, no impurities whatsoever can now penetrate from the lower region of the SOI substrate into the first element layer 3, where they would lead to deterioration or defects.

As shown in FIG. 2K, an optimum contact is produced by carrying out ES implantation (buried strap) and an approximately 500 nm thick polysilicon layer is deposited, with even relatively large trenches being completely filled. BS polysilicon back-etching is then carried out to produce a BS polylayer 10, which is located approximately 50 nm underneath the silicon surface and the oxide layer 4A.

As shown in FIG. 2L, a lithographic method is then used to define the active areas, with flat trench insulation 11 (STI, shallow trench insulation) preferably being formed using a dry etching method. By way of example, the STI trench insulation 11 is formed by means of oxidation, with subsequent nitride deposition and followed by TEOS deposition, with part of the TEOS oxide which has been deposited being removed once again by means of a chemical-mechanical polishing method. Finally, the remaining nitride mask layer 4B is removed.

As shown in FIG. 2M, VT implantations are then produced for matching to the respective switching voltages, and a gate dielectric is then deposited, or oxidation is carried out. However, in principle, the remaining oxidation mask layer 4A can also be used. To provide first semiconductor elements in the first element layer 3, a gate layer 12 and a gate isolation layer 13 are then deposited, with subsequent structuring and implantation of associated source/drain regions, and the subsequent formation of spacers 14. The production steps for the semiconductor elements AT will not be described in detail at this point, since these are essentially conventional processes.

FIG. 2N shows a simplified section view of the DRAM memory cell formed in this way in the SOI substrate according to the invention, with the semiconductor elements or selection transistors AT formed in the first element layer 3 being embedded in an isolation layer 15, and being connected via a metallization layer 17 and contact holes 16.

In this way, further shrinks can be carried out in particular when using novel materials, and these lead to smaller geometries, while furthermore achieving trench filling layers with less series resistance. The multilayer barrier layer 2 which is used means, in particular, that no isolation collars are required for the production of DRAM memory cells since the multilayer barrier layer 2 reliably prevents vertical leakage currents. In the same way, no impurities whatsoever can penetrate from the first element layer 3 into the further element layers 1, thus improving the characteristic properties of both the selection transistors AT and the trench capacitors C. In the same way, the non-conductive diffusion barrier layer 9 prevents any incompatible materials from diffusing out of the trench capacitor C into the first element layer 3, thus making it possible to provide a reliable diffusion barrier even for an electrically conductive connection.

FIGS. 3A to 3L show simplified cross-sectional views to illustrate production steps for a second exemplary embodiment of a DRAM memory cell. The same reference symbols once again denote identical or corresponding elements or layers, and these will therefore not be described again in the following text.

As shown in FIGS. 3A to 3L, the SOI substrate now includes a first element layer 3, a multilayer barrier layer 2' and a further element layer 1', with the further element layer 1' now being composed of an insulating material, such as $SiO_2$. Furthermore, according to the second exemplary embodiment, the multilayer barrier layer 2' includes an electrically conductive diffusion barrier layer 2A' and an electrically isolating potential barrier layer 2B'. The electrically conductive diffusion barrier layer 2A' is composed, for example, of W, WN or $WSi_x$ in the same way as the conductive diffusion barrier layer 9 in the first exemplary embodiment. However, it may also have Ti—, TiSi—, Ta—, TaN—, TiN—, Pt—, Ru—, RuO—, Ir—, Mo—, Co—, Ni—, Hf—, Zr—, NiSi—, MoN—, HfN—, MoSi—, CoSi—, TaSi—, Au—, Ag—, Cu—, Al—, WSiN—, C, Fe or compounds of these materials as the material. In the situation where a conductive material is used, which does not represent a diffusion barrier, further layers may also be provided as diffusion barrier layers. In the same way, instead of the insulating material, an electrically conductive or semiconductive material may also be used for the further element layer 1'.

Figure 3A:
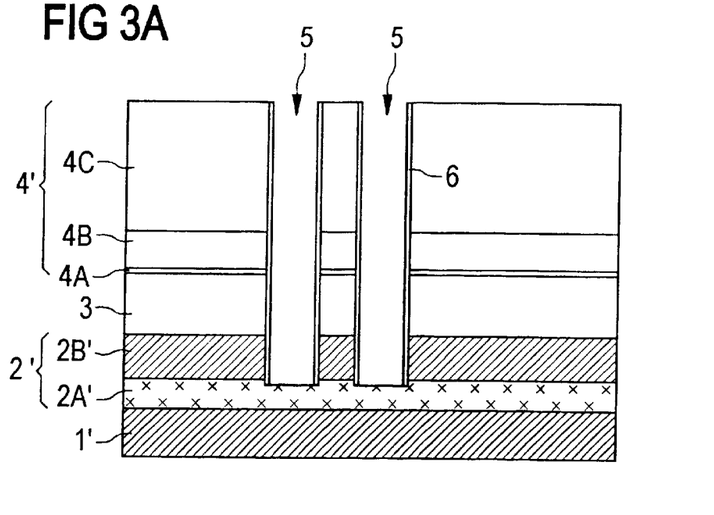
FIGS. 3A to 3L show simplified cross-sectional views in order to illustrate a production method for a second exemplary embodiment of a DRAM memory cell.

As shown in FIG. 3A, a mask layer 4', which corresponds to the SOI substrate, is once again formed together with its layer elements 4A, 4B and 4C, after which trenches 5 and a diffusion barrier layer 6 are formed on the trench walls.

Figure 3B:
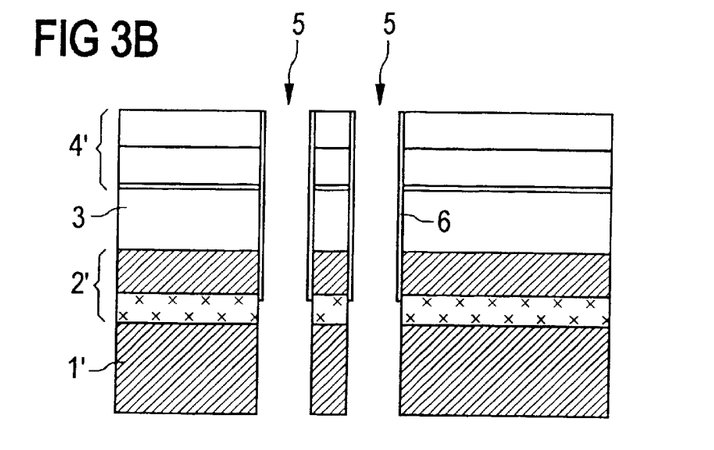
Figure 3C:
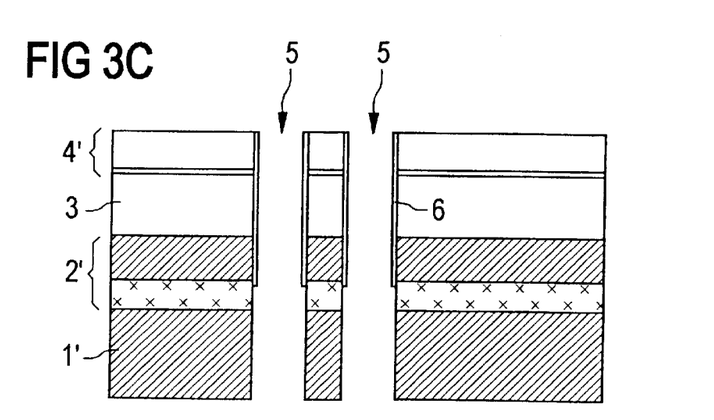
Figure 3D:
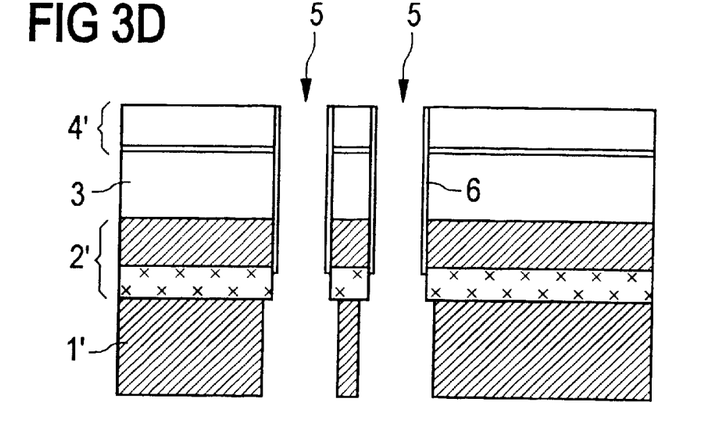
Figure 3E:
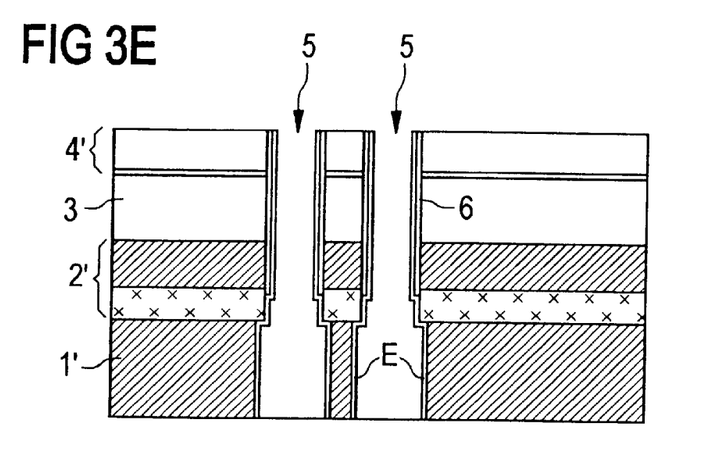
Figure 3F:
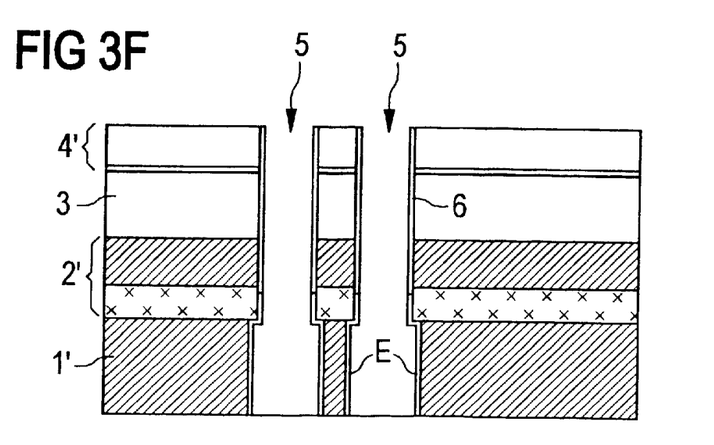
Figure 3G:
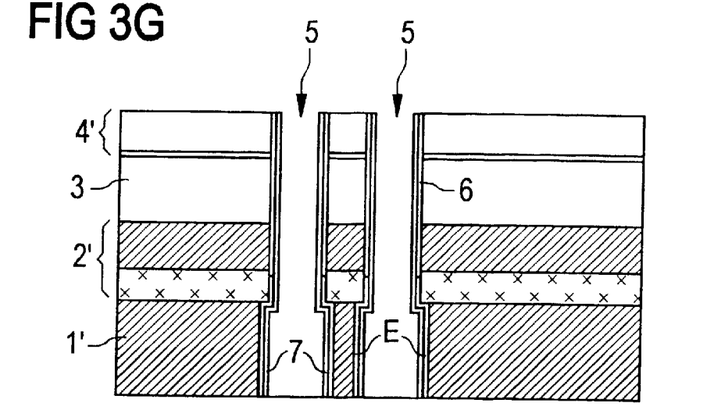
Figure 3H:
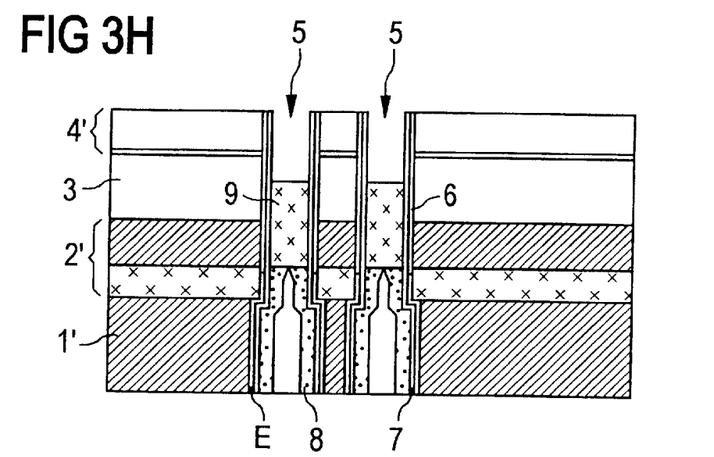
Figure 3I:
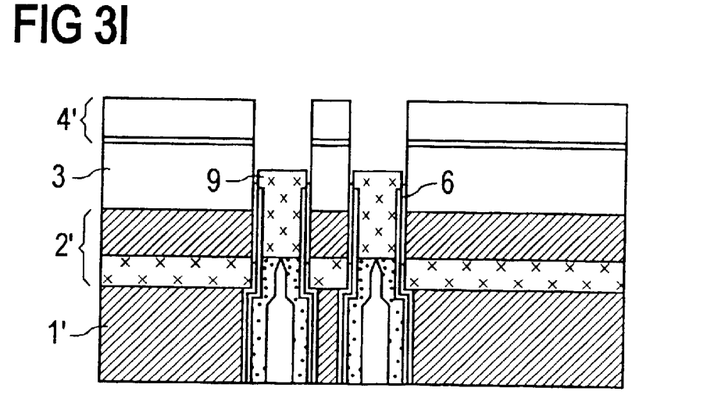
Figure 3J:
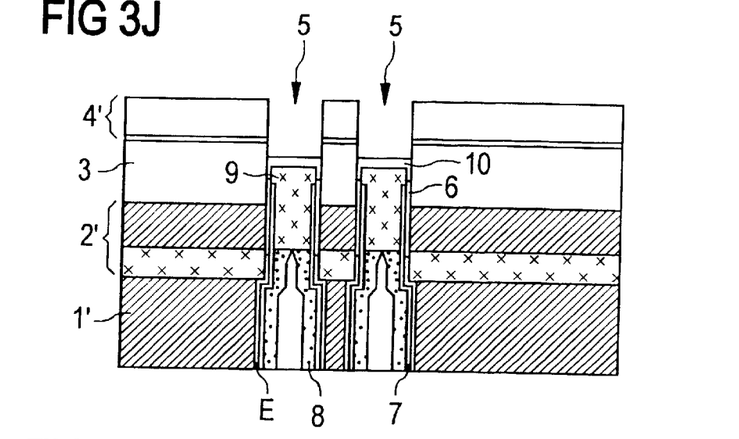
Figure 3K:
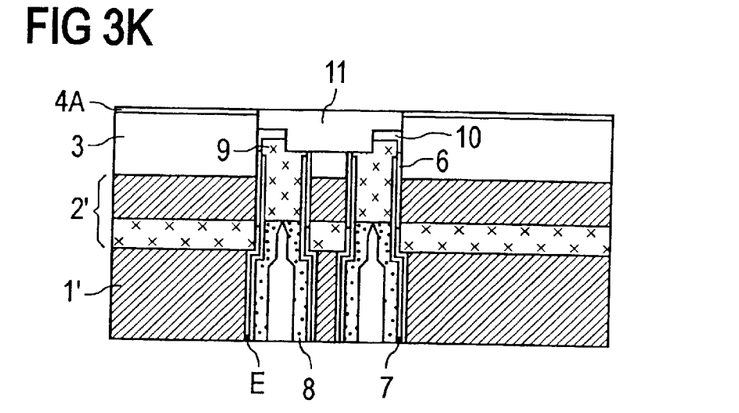
Figure 3L:
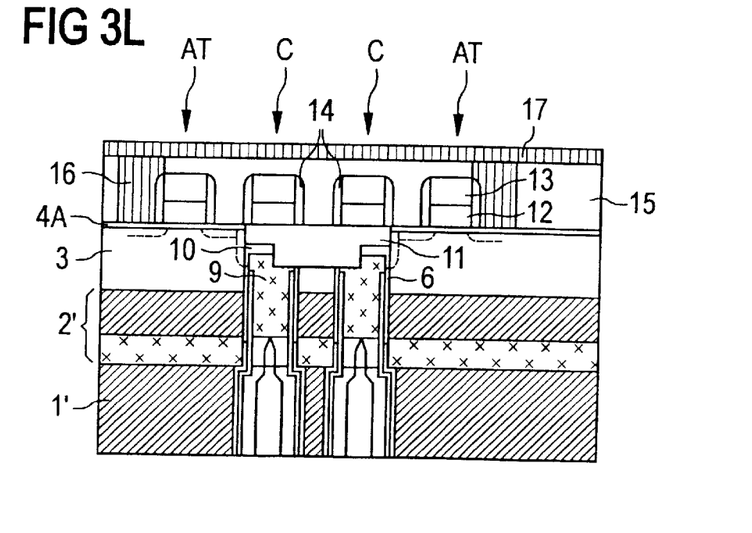

As shown in FIGS. 3B to 3D, the mask layer 4' is then used to form the trench 5 extending into the further element layer 1', and is optionally widened in the lower region, for example, in order to increase a capacitance. This will not be described in detail in the following text, since the steps essentially correspond to those for the first exemplary embodiment.

However, since a further isolating element layer 1' and a multilayer barrier layer 2' with a conductive diffusion barrier layer 2A' are used in the second exemplary embodiment. The method step shown in FIG. 3E includes deposition of an electrically conductive or metallic electrode E, which essentially represents an outer electrode for the trench capacitor.

As shown in FIGS. 3F to 3L, once the electrically conductive outer electrode E has been recessed in, a capacitor dielectric 7, an inner electrode 8, a conductive diffusion barrier layer 9, a BS polysilicon layer 10, STI trench insulation 11 and the associated selection transistors AT are then once again formed in a corresponding manner to FIGS. 2G to 2N. Since the associated production steps essentially correspond to the production steps shown in FIG. 2, their description will not be repeated in the following text. In particular as a result of the use of a multilayer barrier layer 2 with a potential barrier and a diffusion barrier, together with a conductive diffusion barrier layer 9 in order to prevent diffusion of impurities between the first and second element layers 1' and 3, it is now possible to design semiconductor circuits which can be scaled down to orders of magnitude of less than 100 nm.

Figure 4A:
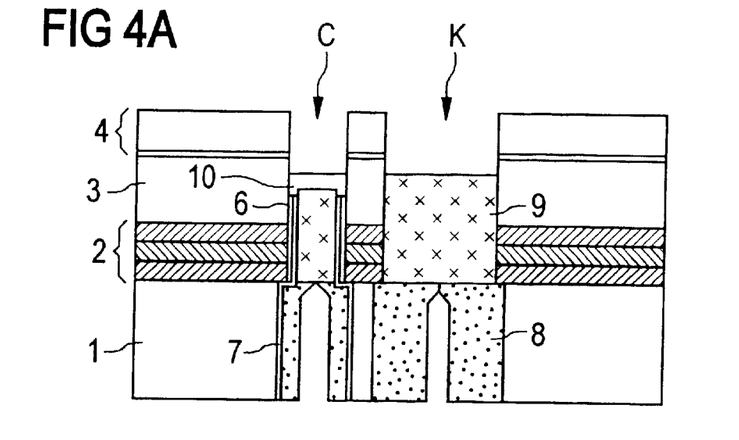
FIGS. 4A and 4b show simplified cross-sectional views in order to illustrate a production method for a contact connection for the DRAM memory cell illustrated in FIG. 2N.
Figure 4B:
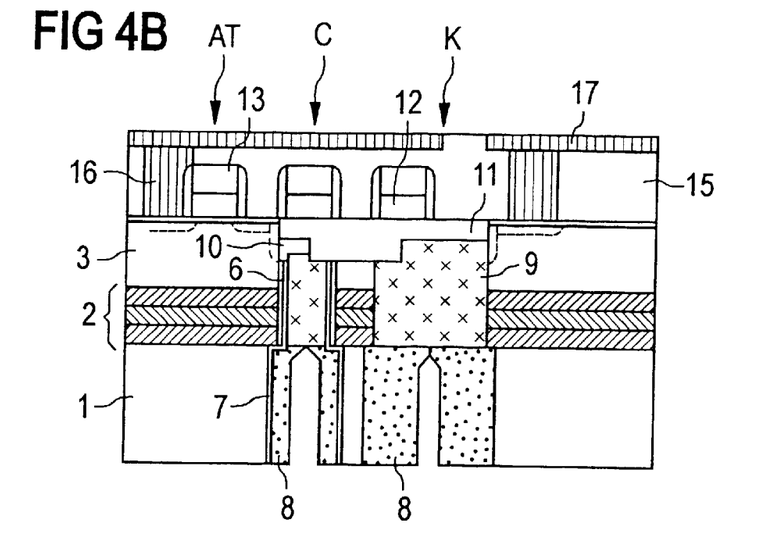

FIGS. 4A and 4B show simplified cross-sectional views to illustrate production steps for contact connection to a first embodiment of a DRAM memory cell. The same reference symbols once again denote identical elements and layers, and these will therefore not be described again in the following text.

As shown in FIGS. 4A and 4B, no further process steps are required to make contact with the outer electrode (not illustrated) of the memory capacitor C. In fact, the contact K can be formed at the same time as the trench capacitors C, and can be produced very easily using appropriately matched layers and appropriately matched trench insulation 11. As shown in FIGS. 4A and 4B, both the capacitor dielectric 7 and the diffusion barrier layer 6 can in this case be completely removed from the widened trench for the contact K. As shown in FIGS. 4A and 4b, the contact K, which is formed in an enlarged, deep trench, has a diffusion barrier layer 9 and an inner electrode layer 8. However, it may consist entirely of the conductive diffusion barrier layer 9 or, furthermore, may have a BS polysilicon layer (not illustrated). In this way, a semiconductor element or trench capacitor C in the further element layer 1 is connected directly, using the same process.

Figure 5:
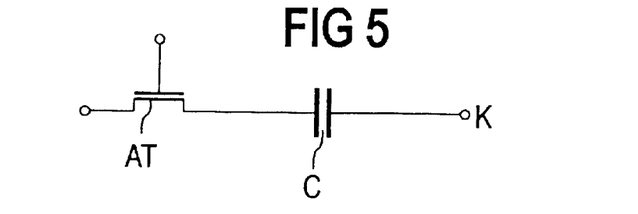
FIG. 5 shows an equivalent circuit of the DRAM memory cell illustrated in FIG. 4B.

FIG. 5 shows an equivalent circuit of the DRAM memory cell illustrated in FIG. 4B. In this case, the conductive diffusion barrier layers 9 in particular, which allow an electrical connection from the trench capacitor C for the contact K and for the selection transistor AT, prevent diffusion of impurities between the first element layer 3 and the at least one further element layer 1.

This results in semiconductor circuits which, using novel materials, can be scaled without any problems down to a structure size of below 100 nm. Particularly when using trenches to provide semiconductor elements in the further element layers, there is thus no need for any parasitic vertical transistors, as a result of which no leakage currents whatsoever occur between these regions, and the data retention time, for example, is thus improved. Furthermore, the conductivity in the trench is increased since the lack of the previously required collar insulation provides a larger available cross section. Furthermore, the complexity of the overall process is reduced since there is no need to form any collar insulation or buried plates, particularly for the production of DRAM memory cells. Furthermore, the production method described above is compatible with the various methods for enlarging the surface area, such as HSG, mesopores and the already described trench widening. Particularly if a conductive material is used as the first element layer, an increased capacitance is obtained since no depletion zone is produced on the side of the outer electrode.

The present invention has been described in particular with reference to a DRAM memory cell. However, it is not limited to this and, in fact, covers all other semiconductor circuits in which semiconductor elements are arranged in different element regions or element layers and for which the use of incompatible materials is desirable.

We claim:
1. A semiconductor circuit, comprising:
   a SOI substrate, including:
      a first element layer,
      at least one second element layer, and
      at least one isolation layer located between said first element layer and said second element layer, said isolation layer including a diffusion barrier and a multilayer barrier layer with a potential barrier;
   at least one first semiconductor element that is formed in said first element layer;
   at least one second semiconductor element that is formed in said at least second element layer; and
   a conductive diffusion barrier layer electrically connecting said first semiconductor element and said second semiconductor elements.

2. A DRAM memory cell, comprising:
   a SOI substrate, including:
      a first element layer,
      at least one second element layer, and
      at least one isolation layer located between said first element layer and said second element layer, said isolation layer including a diffusion barrier and a multilayer barrier layer with a potential barrier;
   at least one first semiconductor element that is formed in said first element layer;
   at least one second semiconductor element that is formed in said at least second element layer; and
   a conductive diffusion barrier layer electrically connecting said first semiconductor element and said second semiconductor elements;
   said first semiconductor element including a selection transistor; and
   said second semiconductor element including a trench capacitor.

3. The semiconductor circuit according to claim 1 wherein:
   the semiconductor circuit is a DRAM memory cell;
   said first semiconductor element includes a selection transistor; and
   said second semiconductor element includes a trench capacitor.

4. The semiconductor circuit according to claim 1, wherein said multilayer barrier layer includes a plurality of different isolation layers.

5. The semiconductor circuit according to claim 4, wherein said multilayer barrier layer includes a $SiO_2/Si_3N_4/SiO_2$ layer sequence.

6. The semiconductor circuit according to claim 1, wherein said multilayer barrier layer includes at least one isolation layer and at least one conductive layer.

7. The semiconductor circuit according to claim 6, wherein said multilayer barrier layer includes at least one conductive layer including a material selected from the group consisting of Ti, TiSi, Ta, TaN, TiN, Pt, Ru, RuO, Ir, Mo, Ca, Ni, Hf, Zr, Ni—Si, MoN, HfN, MoSi, CoSi, TaSi, Au, Ag, Cu, Al, WSiN, C, Fe, W, WN and $WSi_x$.

8. The semiconductor circuit according to claim 1, wherein said at least one second element layer includes a layer selected from the group consisting of an isolating layer, a semiconductive layer and a conductive layer.

9. The semiconductor circuit according to claim 1, wherein said multilayer barrier layer includes a thermal compensation layer.

* * * * *